United States Patent
Jeong et al.

(10) Patent No.: US 7,479,455 B2
(45) Date of Patent: Jan. 20, 2009

(54) METHOD FOR MANUFACTURING SEMICONDUCTOR WAFER

(75) Inventors: Ki-Kwon Jeong, Cheonan-si (KR); Hyeon Hwang, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 166 days.

(21) Appl. No.: 11/157,905

(22) Filed: Jun. 22, 2005

(65) Prior Publication Data
US 2006/0166462 A1   Jul. 27, 2006

(30) Foreign Application Priority Data
Jan. 25, 2005   (KR) .................. 10-2005-0006795

(51) Int. Cl.
*H01L 21/302* (2006.01)
(52) U.S. Cl. .................. 438/692; 438/693; 438/698; 216/20; 216/52
(58) Field of Classification Search ............. 438/693, 438/698, 692; 216/20, 52
See application file for complete search history.

(56) References Cited

U.S. PATENT DOCUMENTS

| | | | |
|---|---|---|---|
| 6,667,191 B1 | 12/2003 | McLellan et al. | |
| 2003/0001283 A1* | 1/2003 | Kumamoto | 257/778 |
| 2003/0209310 A1* | 11/2003 | Fuentes et al. | 156/154 |
| 2004/0087146 A1* | 5/2004 | Paterson et al. | 438/687 |
| 2004/0147120 A1* | 7/2004 | Rogalli et al. | 438/689 |
| 2005/0085008 A1* | 4/2005 | Derderian et al. | 438/106 |
| 2005/0161774 A1* | 7/2005 | Saimoto et al. | 257/642 |
| 2006/0003550 A1* | 1/2006 | Periasamy et al. | 438/459 |
| 2006/0008650 A1* | 1/2006 | Wesselmann et al. | 428/411.1 |

FOREIGN PATENT DOCUMENTS

| | | |
|---|---|---|
| JP | 2004-031825 | 1/2004 |
| JP | 2004-228133 | 8/2004 |
| JP | 2004/327464 | 11/2004 |

* cited by examiner

*Primary Examiner*—Binh X Tran
(74) *Attorney, Agent, or Firm*—Harness, Dickey & Pierce

(57) ABSTRACT

A method may involve mounting a first supporting plate on an active surface of a wafer using an adhesive. A portion of the back surface of the wafer may be backlapped. A second supporting plate may be mounted on the back surface of the wafer using an adhesive. The first supporting plate may be removed from the active surface of the wafer. Conductive bumps may be provided on the active surface. A backlapping process may include a first grinding process, a second grinding process, and a polishing process. The first and the second supporting plates may be fabricated from a solid material. The adhesive may be an ultraviolet cure adhesive or a thermal cure adhesive.

22 Claims, 5 Drawing Sheets

METHOD FOR MANUFACTURING SEMICONDUCTOR WAFER

PRIORITY STATEMENT

This U.S. non-provisional application claims benefit of priority under 35 U.S.C. § 119 from Korean Patent Application No. 2005-6795, filed on Jan. 25, 2005, the entire contents of which are incorporated herein by reference.

BACKGROUND

1. Field of the Invention

The present invention relates in general to a semiconductor manufacturing technique, and more particularly, to a method for manufacturing a semiconductor wafer.

2. Description of the Related Art

Semiconductor package structures may include semiconductor packages implementing conductive bumps. Such semiconductor packages may include, for example, flip chip packages and wafer level packages. Semiconductor packages implementing conductive bumps may be advantageous in electrical and thermal characteristics and mounting area, as compared to wire bonding packages.

Conductive bumps may be provided on semiconductor chips at a wafer level. FIG. 1 is a schematic cross-sectional view of a conventional semiconductor wafer 10 having conductive bumps 16.

Referring to FIG. 1, the semiconductor wafer 10 may have an active surface 11 and a back surface 12. A plurality of integrated circuits 13 may be provided on and/or in the semiconductor wafer 10. Scribe lines 14 may be provided between adjacent integrated circuits 13. I/O pads 15 may be provided on the active surface 11 of the semiconductor wafer 10. Conductive bumps 16 may be provided on the I/O pads 15. The conductive bumps 16 may be fabricated from a conductive material, for example a solder and/or gold (Au). The conductive bumps 16 may serve as external connection terminals to be mechanically and electrically connected to external devices.

The semiconductor wafer 10 may be separated into individual semiconductor chips. The separation process may be achieved via a mechanical sawing technique, for example. Before the sawing process, a portion of a back surface of the semiconductor wafer 10 may be removed. Such a process may be referred to as a backgrinding process and/or a backlapping process. The backlapping process may reduce the thickness of a semiconductor wafer 10. For example, a semiconductor wafer having a diameter of 8 inches may have an initial thickness between 730 µm and 750 µm. A semiconductor wafer having a diameter of 12 inches may have an initial thickness between 780 µm and 800 µm. After a backlapping process, the thickness of semiconductor wafers may be 500 µm or less.

Although conventional fabricating techniques are generally thought to be acceptable, they are not without shortcomings. For example, a backlapping process may cause bending and/or warpage of the semiconductor wafer. If a backlapping process is performed on a semiconductor wafer having conductive bumps, the conductive bumps and/or the semiconductor wafer may be damaged, and/or the conductive bumps may be separated from the semiconductor wafer.

The bending and/or warpage of a semiconductor wafer may result from heat generated during a backlapping process. For example, the coefficient of thermal expansion (CTE) of a main material of the integrated circuits may be different from that of a main material of the wafer, for example silicon. Therefore, the active surface of the semiconductor wafer having the integrated circuits may have a different CTE as compared to that of the back surface of the semiconductor wafer. Such a difference in CTE may create critical faults in the semiconductor wafer, especially one that may have a reduced thickness after a backlapping process.

FIG. 2 is a photograph showing warpage of a semiconductor wafer after a backlapping process.

SUMMARY OF THE INVENTION

According to an example, non-limiting embodiment of the invention, a method may involve mounting a first supporting plate on an active surface of a wafer. A portion of a back surface of the wafer may be backlapped. A second supporting plate may be mounted on the back surface of the wafer. Conductive bumps may be provided on the active surface.

According to another example, non-limiting embodiment of the invention, a method may involve mounting a first supporting plate of a solid material on an active surface of a wafer. A portion of a back surface of the wafer may be backlapped. A second supporting plate of a solid material may be mounted on the back surface of the wafer. The first supporting plate may be removed from the active surface of the wafer. Conductive bumps may be provided on the active surface.

According to another example, non-limiting embodiment of the invention, a method may involve mounting a first supporting plate on an active surface of a wafer. A portion of a back surface of the wafer may be removed. A second supporting plate may be mounted on the back surface of the wafer. Conductive bumps may be provided on the active surface.

BRIEF DESCRIPTION OF THE DRAWINGS

Example, non-limiting embodiments of the present invention will be readily understood with reference to the following detailed description thereof provided in conjunction with the accompanying drawings, wherein like reference numerals designate like structural elements.

These drawings are provided for illustrative purposes only and are not drawn to scale. The spatial relationships and relative sizing of the elements illustrated in the various embodiments may have been reduced, expanded and/or rearranged to improve the clarity of the figure with respect to the corresponding description. The figures, therefore, should not be interpreted as accurately reflecting the relative sizing or positioning of the corresponding structural elements that could be encompassed by an actual device manufactured according to the example, non-limiting embodiments of the invention.

DETAILED DESCRIPTION OF THE EXAMPLE EMBODIMENTS

Example, non-limiting embodiments of the present invention will now be described more fully with reference to the accompanying drawings. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

Well-known structures and processes are not described or illustrated in detail to avoid obscuring the present invention.

An element is considered as being mounted (or provided) "on" another element when mounted (or provided) either directly on the referenced element or mounted (or provided) on other elements overlaying the referenced element. Throughout this disclosure, the terms "upper," "lower" "top" and "back" are used for convenience in describing various elements or portions or regions of the elements as shown in the figures. These terms do not, however, require that the structure be maintained in any particular orientation.

Figure 1:
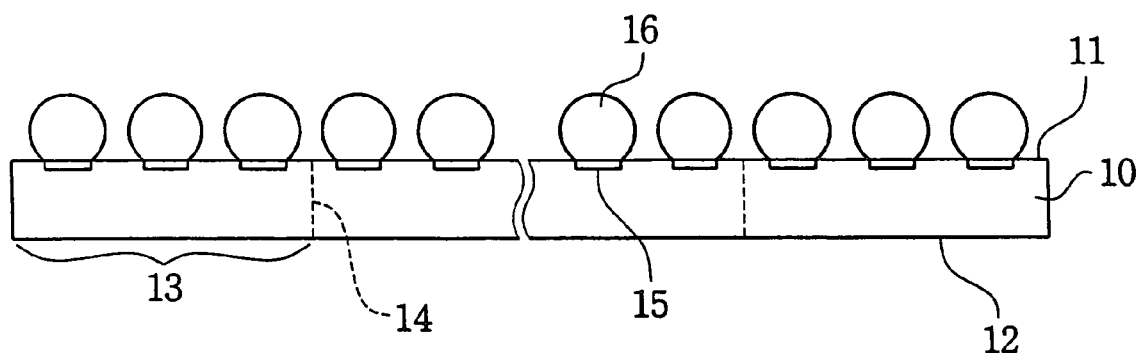
FIG. 1 is a schematic cross-sectional view of a conventional semiconductor wafer having conductive bumps.
Figure 2:
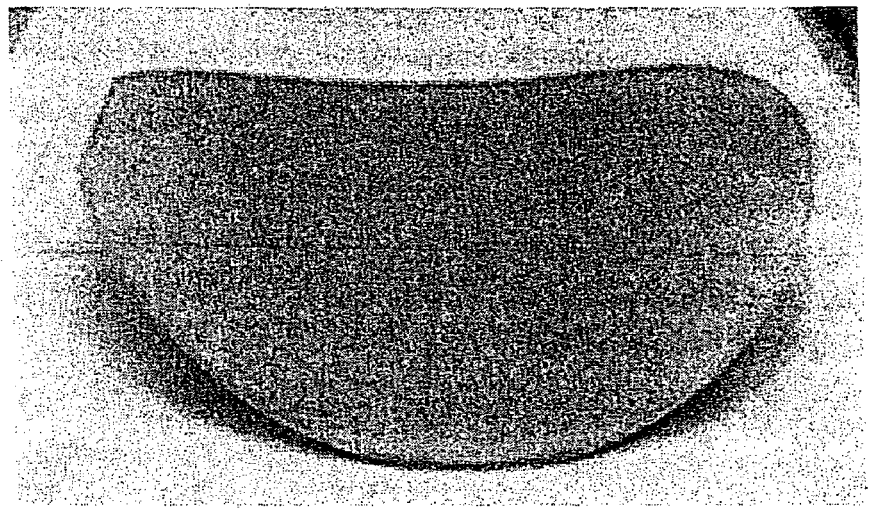
FIG. 2 is a photograph showing warpage of a semiconductor wafer that may occur after a backlapping process.
Figure 3:
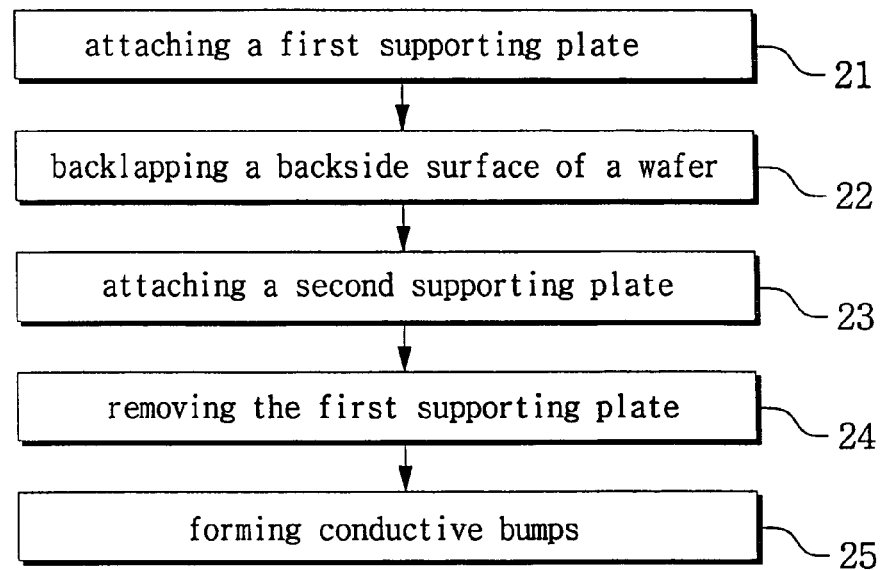
FIG. 3 is a flow chart of a method that may be implemented to manufacture a semiconductor wafer in accordance with an example, non-limiting embodiment of the present invention.

FIG. 3 is a flow chart of a method that may be implemented to manufacture a semiconductor wafer in accordance with an example, non-limiting embodiment of the present invention.

In this example embodiment, the method may involve attaching a first supporting plate to an active surface of a wafer (at 21). A portion of a back surface of the wafer may be removed (at 22). A second supporting plate may be attached to the back surface of the wafer (at 23). The first supporting plate may be removed (at 24). Conductive bumps may be provided on the active surface of the wafer (at 25).

FIGS. 4A through 4E are schematic cross-sectional views of a method that may be implemented to manufacture a semiconductor wafer in accordance with an example, non-limiting embodiment of the present invention.

Figure 4A:
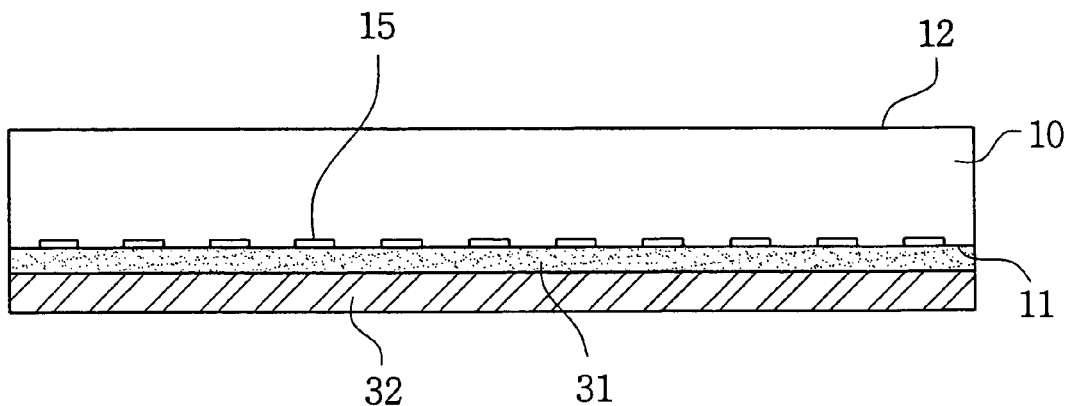
FIGS. 4A through 4E are schematic cross-sectional views of a method that may be implemented to manufacture a semiconductor wafer in accordance with an example, non-limiting embodiment of the present invention.

Referring to FIG. 4A, a wafer 10 may have an active surface 11 and a back surface 12. I/O pads 15 may be provided on the active surface 11 of the wafer 10. A first supporting plate 32 may be mounted on the active surface 11 of the wafer 10. By way of example only, the first supporting plate 32 and the wafer 10 may be held together by a first adhesive 31. In alternative embodiments, the first supporting plate 32 and the wafer 10 may be held together by other alternative fasteners including (but not limited to) screws, nails, clips, staples and/or pins, for example.

The first adhesive 31 may be, for example, a sheet type adhesive that may include an ultraviolet cure adhesive and/or a thermal cure adhesive. In alternative embodiments, numerous other adhesives that are well known in this art may be suitably implemented.

The first supporting plate 32 may prevent the wafer 10 from bending and/or warping during subsequent processing. The first supporting plate 32 may be fabricated from a solid material, for example a glass and/or a plastic. In alternative embodiments, the first supporting plate 32 may be fabricated from numerous other materials that are well known in this art. The first supporting plate 32 may have the same shape as the wafer 10. However, the shape of the first supporting plate 32 may be not limited in this regard.

Figure 4B:
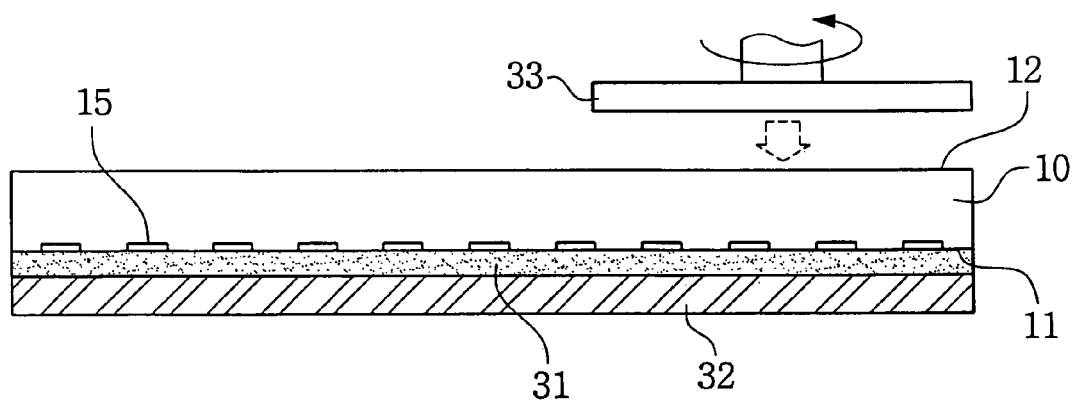

Referring to FIG. 4B, a portion of the wafer may be removed. This removal process may be implemented via a mechanical process, for example, backlapping. For example, the back surface 12 of the wafer 10 may be backlapped using a grinding wheel 33. The grinding wheel 33 may press against the back surface 12 of the wafer 10 while rotating. The grinding wheel 33 may grind the back surface 12 of the wafer 10.

The wafer 10 may be mounted on a chuck table (not shown). The chuck table may rotate in the same or reverse direction to that of the grinding wheel 33.

By way of example only, the backlapping process may include a rough grinding process, a fine grinding process and a polishing process. The rough grinding process may grind the backside surface 12 of the wafer 10 using a grinding wheel having a rough surface. The fine grinding process may grind the backside surface 12 of the wafer 10 using a grinding wheel having a fine surface. The polishing process may polish the backside surface 12 of the wafer 10 using a slurry. In alternative embodiment, more or less grinding and/or polishing processes may be suitably implemented.

For example, a wafer 10 having a diameter of 8 inches may have an initial thickness between 730 µm and 750 µm. A wafer 10 having a diameter of 12 inches may have an initial thickness between 780 µm and 800 µm. The initial thickness may be reduced by hundreds of µm via rough grinding, by about 20 µm via fine grinding, and by about 1 µm to 2 µm via polishing. As a result, the final thickness of the wafer 10 may be 500 µm or less, for example 300 µm. The grinding wheel of the rough grinding process may have a grain size between 300 mesh and 350 mesh, for example about 325 mesh. The grinding wheel of the fine grinding process may have a grain size between 1,500 mesh and 2,500 mesh, for example about 2,000 mesh.

Figure 4C:
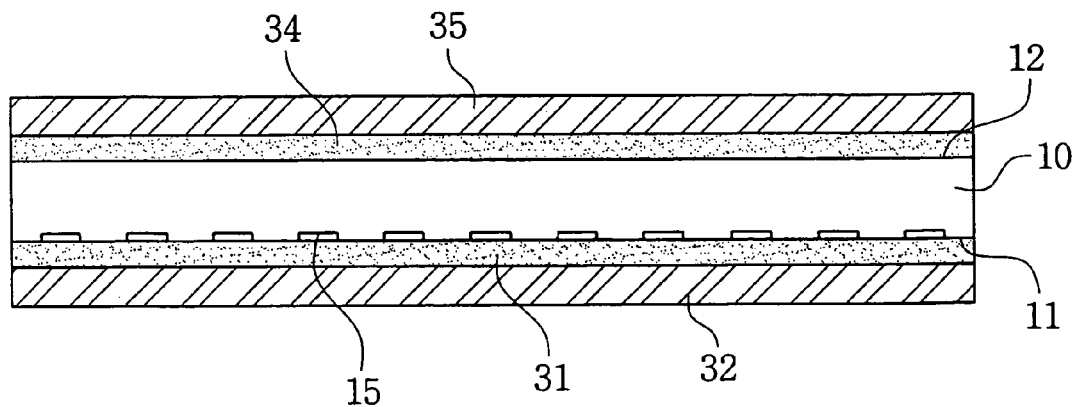

Referring to FIG. 4C, a second supporting plate 35 may be mounted on the back surface 12 of the wafer 10. By way of example only, the second supporting plate 35 and the wafer 10 may be held together by a second adhesive 34. In alternative embodiments, the second supporting plate 35 and the wafer 10 may be held together by other alternative fasteners including (but not limited to) screws, nails, clips, staples and/or pins, for example.

The second adhesive 34 may be, for example, a sheet type adhesive that may include an ultraviolet cure adhesive and/or a thermal cure adhesive. In alternative embodiments, numerous other adhesives that are well known in this art may be suitably implemented.

Figure 4D:
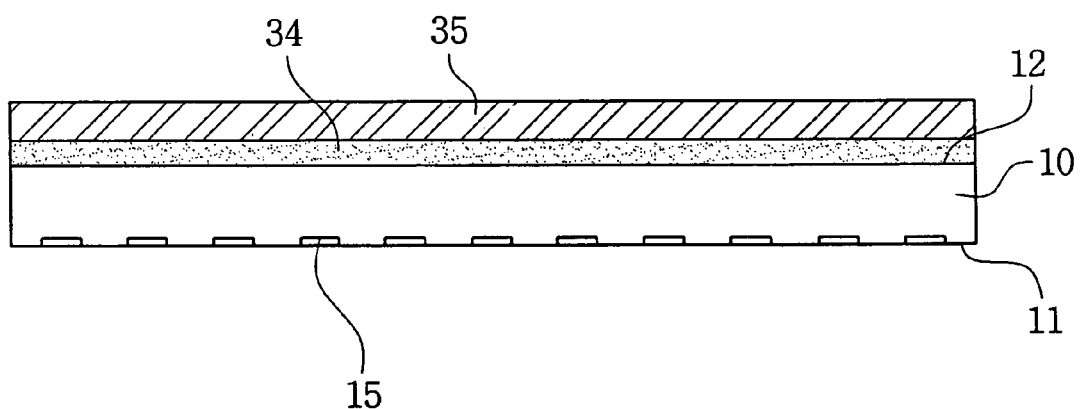

Referring to FIG. 4D, the first supporting plate 32 may be removed from the active surface 11 of the wafer 10. The first supporting plate 32 may be removed via numerous and alternative techniques that are well known in this art.

The second supporting plate 35 may prevent the wafer 10 from bending and/or warping after the first supporting plate 31 has been removed. The second supporting plate 35 may be fabricated from a solid material, for example a glass and/or a plastic. In alternative embodiments, the second supporting plate 35 may be fabricated from numerous other materials that are well known in this art. The second supporting plate 35 may have the same shape as the wafer 10. However, the shape of the second supporting plate 35 may be not limited in this regard.

In an example embodiment, the second supporting plate 35 may be fabricated from a glass, and the second adhesive 34 may be an ultraviolet cure adhesive. In this way, ultraviolet rays may irradiate the adhesive 34 through the second supporting plate 35.

Figure 4E:
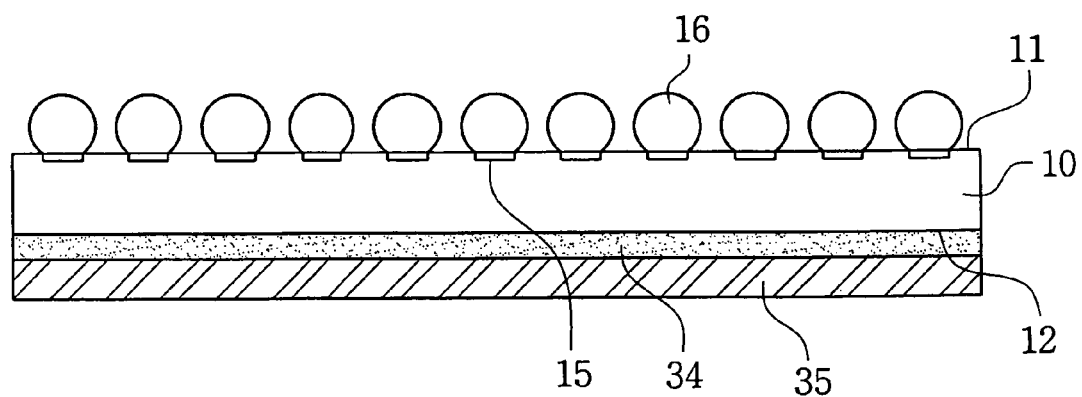

Referring to FIG. 4E, conductive bumps 16 may be provided on the I/O pads 15 of the wafer 10. The conductive bumps 16 may be fabricated from, for example a solder and/or gold (Au). The conductive bumps 16 may also be fabricated from numerous other alternative materials that are well known in this art. The conductive bumps 16 may be fabricated using a plating method, a stencil printing method and/or a ball mounting method.

A separating process and a package assembly process may be performed. The separating process may involve separating (via a sawing process for example) the wafer 10 into individual substrates. Separating process and package assembly process are well known in this art. The second supporting plate 35 may be removed before or after the separating process.

Although example, non-limiting embodiments of the present invention have been described in detail, it will be understood that many variations and/or modifications of the basic inventive concepts, which may appear to those skilled in the art, will still fall within the spirit and scope of the example embodiments of the present invention as defined in the appended claims.

What is claimed is:

1. A method comprising:
   mounting a first supporting plate on an active surface of a wafer;
   backlapping a portion of a back surface of the wafer, the backlapping including:
      a first grinding process for grinding the back surface using a first grinding wheel,
      a second grinding process for grinding the back surface using a second grinding wheel having a grinding surface that is less rough than a grinding surface of the first grinding wheel, and
      a polishing process for polishing the back surface using a slurry; mounting a second supporting plate on the back surface of the wafer; and
   forming conductive bumps on the active surface after the first supporting plate is removed from the active surface.

2. The method of claim 1, wherein the backlapping reduces a thickness of the wafer from an initial thickness of between 730 μm and 800 μm to a reduced thickness of 500 μm or less.

3. The method of claim 1, wherein the first grinding process reduces the thickness of the wafer by hundreds of μm, the second grinding process reduces the thickness of the wafer by about 20 μm, and the polishing process reduces the thickness of the wafer by about 1 μm to 2 μm.

4. The method of claim 1, wherein the conductive bumps are fabricated from one of a solder and gold.

5. The method of claim 1, wherein the conductive bumps are fabricated using a plating method, a stencil printing method, and a ball mounting method.

6. The method of claim 1, wherein the first grinding wheel has a grain size between 300 mesh and 350 mesh, and the second grinding wheel has a grain size between 1,500 mesh and 2,500 mesh.

7. The method of claim 6, wherein the first grinding wheel has a grain size of about 325 mesh, and the second grinding wheel has a grain size of about 2,000 mesh.

8. The method of claim 1, wherein the first supporting plate is mounted on the wafer using an adhesive.

9. The method of claim 8, wherein the adhesive is a sheet type adhesive.

10. The method of claim 8, wherein the adhesive is one of an ultraviolet cure adhesive and a thermal cure adhesive.

11. The method of claim 1, wherein the first supporting plate is fabricated from a solid material.

12. The method of claim 11, wherein the first supporting plate is fabricated from one of a glass and a plastic.

13. The method of claim 1, wherein the second supporting plate is mounted on the wafer using an adhesive.

14. The method of claim 13, wherein the adhesive is a sheet type adhesive.

15. The method of claim 13, wherein the adhesive is one of an ultraviolet cure adhesive and a thermal cure adhesive.

16. The method of claim 1, wherein the second supporting plate is fabricated from a solid material.

17. The method of claim 16, wherein the second supporting plate is fabricated from one of a glass and a plastic.

18. A method comprising:
   mounting a first supporting plate of a solid material on an active surface of a wafer;
   backlapping a portion of a back surface of the wafer, the backlapping including:
      a first grinding process for grinding the back surface using a first grinding wheel having a grain size between 300 mesh and 350 mesh,
      a second grinding process for grinding the back surface using a second grinding wheel having a grain size between 1,500 mesh and 2,500 mesh, and
      a polishing process for polishing the back surface using a slurry;
   mounting a second supporting plate of a solid material on the back surface of the wafer;
   removing the first supporting plate from the active surface of the wafer; and
   forming conductive bumps on the active surface after the first supporting plate is removed from the active surface.

19. The method of claim 18, wherein the second supporting plate is fabricated from a glass material.

20. The method of claim 18, wherein the second supporting plate is mounted on the wafer using an adhesive.

21. The method of claim 20, wherein the adhesive is a sheet type adhesive.

22. The method of claim 21, wherein the adhesive is one of an ultraviolet cure adhesive and a thermal cure adhesive.

* * * * *